United States Patent [19]

Nishimura

[11] 4,062,039

[45] Dec. 6, 1977

[54] SEMI-CONDUCTOR INTEGRATED CIRCUIT

[75] Inventor: Izuhiko Nishimura, Suwa, Japan

[73] Assignee: Kabushiki Kaisha Suwa Seikosha, Tokyo, Japan

[21] Appl. No.: 654,688

[22] Filed: Feb. 3, 1976

[30] Foreign Application Priority Data

Feb. 3, 1975   Japan .................................. 50-14112

[51] Int. Cl.² .................... H01L 27/02; H01L 29/34; H01L 29/78
[52] U.S. Cl. ........................................ 357/51; 357/23; 357/40; 357/41; 357/42; 357/52
[58] Field of Search ....................... 357/23, 40, 41, 42, 357/51, 52

[56] References Cited

U.S. PATENT DOCUMENTS 3,673,428   6/1972   Athanas .................................. 357/42

OTHER PUBLICATIONS

IBM – Tech. Bul. – vol. 15, No. 2, July 1972, W. Baechtold.

Primary Examiner—Edward J. Wojciechowicz
Attorney, Agent, or Firm—Blum, Moscovitz, Friedman & Kaplan

[57] ABSTRACT

An improved semi-conductor integrated circuit wherein the likelihood of permanent breakdown of reverse junctions in the integrated circuitry in response to unexpected high voltages applied thereto is substantially reduced. The semi-conductor integrated circuitry includes at least two field-effect transistors and defines a circuit having at least one output terminal. At least one of the field-effect transistors includes a drain output terminal, and a resistance for reducing the secondary breakdown at the drain output terminal of the reverse junction between the drain output terminal and the semi-conductor integrated circuit substrate, said resistance being disposed intermediate said drain output terminal and said circuit output terminal.

9 Claims, 7 Drawing Figures

SEMI-CONDUCTOR INTEGRATED CIRCUIT

BACKGROUND OF THE INVENTION

This invention is directed to preventing the likelihood of permanent breakdown of reverse junctions in MOS semi-conductor integrated circuits, and in particular, to preventing secondary breakdown of the reverse junction of a C-MOS integrated circuit in response to unexpected high voltages being applied thereto.

The problem of breakdown voltages applied to gate electrode of MOS transistors is well-known in the art. Sudden and unexpected applications of external electric fields having a high voltage and low energy density, such as static electricity to the gate electrode are likely to cause a dielectric breakdown of the reverse bias junction. Usually, the breakdown is not irreversible and upon the suddenly applied external electric field being removed, the junction returns to the normal state. Such breakdown is called "primary" breakdown and refers to a breakdown condition which is not irreversible. Nevertheless, if the external field is of a sufficiently high voltage as to effect a dielectric breakdown of the gate insulating film of the MOS transistor, a short circuit is formed between the gate electrode and the adjacent portion of the substrate previously insulated from the gate electrode by the gate insulating film (hereinafter referred to as "secondary" breakdown). Accordingly, common practice is to provide a diode clamping circuit at the gate terminal of a C-MOS circuit for absorbing any electric charge that has a voltage higher than the primary breakdown voltage to thereby prevent secondary breakdown of the gate terminal from occurring.

Although such diode clamping circuits have been effective in reducing the occurrences of secondary breakdown at the gate terminal, the reverse junctions between the drain region and output terminals in MOS devices are likely to reach secondary breakdown in response to sudden electric charges such as electrostatic fields being applied thereto. This accounts for breakdowns of the drain portion being observed in integrated circuit devices during assembly of the integrated circuitry and during transit of same.

SUMMARY OF THE INVENTION

Generally speaking, in accordance with the invention, improved semi-conductor integrated circuitry wherein the likelihood of secondary breakdown in response to suddenly applied high voltages is minimized is provided. The integrated circuitry is formed of at least two MOS field-effect transistors and includes respective input and output terminals. At least one of the field-effect transistors includes a drain output terminal. A resistance for reducing the secondary breakdown of the field-effect transistor is coupled intermediate the drain output terminal and the circuit output terminal. Additionally, reverse junctions are formed at selected regions of the integrated circuitry for causing primary breakdown of the reverse junctions at a voltage lower than a predetermined voltage representative of the respective secondary breakdown voltages of the integrated circuit.

Accordingly, it is an object of this invention to prevent dielectric breakdown of a drain region of a C-MOS circuit when the drain terminal is connected to an output terminal and the gate electrode is connected to the drain region.

A further object of this invention is to prevent secondary breakdown of the reverse junction between the drain region and the substrate in response to unexpected high voltages such as static electricity and the like, applied to the drain.

Still a further object of this invention is to provide improved semi-conductor integrated circuitry wherein secondary breakdown of reverse junctions caused by unexpected high voltages is substantially reduced.

Still other objects and advantages of the invention will in part be obvious and will in part be apparent from the specification.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
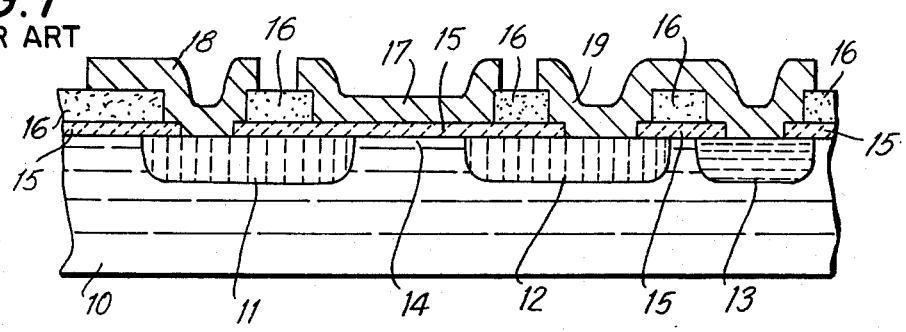
FIG. 1 is a partial sectional view of a MOS transistor constructed in accordance with the prior art.

Reference is now made to FIG. 1, wherein a P-channel MOS transistor is depicted. A N-type lightly doped substrate 10 includes a heavily doped diffused P-type source region 12 and a heavily doped P-type drain region 11. Gate electrode 17 is formed of a metal such as aluminum and is disposed on a thin insulating layer 15 of $SiO_2$, or the like, to define the gate region 14. A drain electrode 18 is coupled to the drain 11 through an opening formed in the metal oxide film 15. A source electrode 19 is coupled to source 12 and is also coupled to an N-type heavily doped diffusion layer 13 provided for isolation. Thick insulating layers 16 are utilized to reduce the wiring capacitance and hence the power consumption of the MOS transistor during use. In such case, the current applied across the drain region 11 and source region 12 is controlled by the voltage applied to the gate electrode 17 as referenced to the substrate 10. Circuitry utilizing both P-channel and N-channel MOS transistors have been utilized to relative advantage in logic circuits and are referred to as C-MOS circuits.

Figure 2:
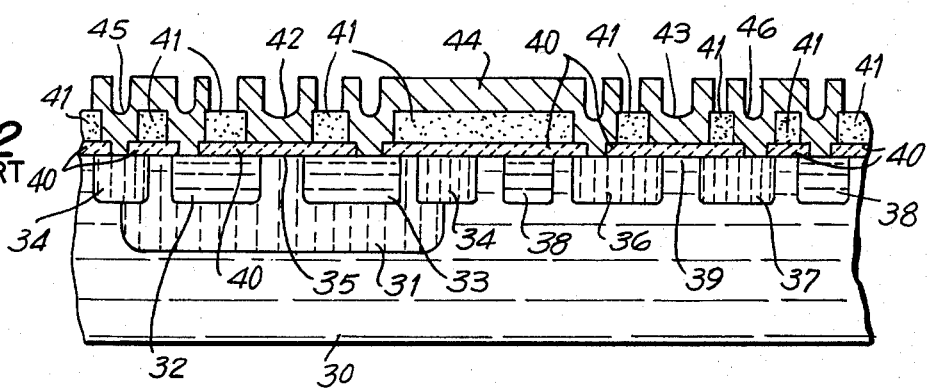
FIG. 2 is a partial sectional view of a C-MOS transistor circuit constructed in accordance with the prior art.

Reference is now made to FIG. 2, wherein a C-MOS circuit of the type utilized in a logic circuit capable of being driven at micro-ampere power levels is provided. A P-type lightly doped layer 31 is diffused in a lightly doped N-type substrate 30. Heavily doped N-type diffusion layers define N-channel MOS transistor source region 32 and drain region 33. Heavily doped P-type diffusion layers define P-channel MOS transistor drain region 36 and source region 37. The respective drain regions 33 and 36 are electrically coupled by electrode 44 to define an output terminal of the C-MOS device.

Gate electrodes 42 and 43 define an input terminal for the C-MOS device and are commonly coupled (not shown). Heavily doped P-type diffusion layer 34 and heavily doped N-type diffusion layer 28, referred to as guard-bands, girdlings or stoppers, are provided for isolating the MOS devices and for applying potentials to the respective substrates. Electrodes 45 and 46 are respectively coupled to the source regions of the N-channel and P-channel transistors to respectively apply negative and positive potentials thereto. Electrodes 45 and 46 are also electrically coupled to stopper regions 34 and 38 respectively. Gate insulating film 40 provides the proper dielectric isolation for the gate regions and a further insulating layer 41 is provided for reducing the electrode capacitance. Accordingly, the breakdown voltage of the C-MOS device is a total of the dielectric breakdown voltage of the gate film 40, the respective breakdown voltages of the reverse junctions formed between the two substrates, i.e., the P-layer 31 and N-layer 30, the reverse junction between the drain 32 and P-layer 31, and the reverse junction between the drain 36 and the N-layer 30.

The dielectric breakdown of the reverse biased junctions can be caused by external electric fields having relatively low energy density such as static electricity. Such primary breakdown is normally not irreversible. Accordingly, once the applied electric field is removed, the reverse biased junction returns to the normal state as noted above, this type of dielectric breakdown is referred to as the primary breakdown of the junction. However, when dielectric breakdown of the gate insulating film occurs, a short circuit between the gate electrode and the portion of the substrate below the gate electrode is effected, thereby resulting in an irreversable breakdown of the device. Accordingly, in order to ensure that the potential applied to the gate electrode is maintained below the gate dielectric breakdown voltage level, gate clamp diode circuits coupled to the gate electrode are utilized.

When such gate clamping diode circuits are utilized, if an external electric field is applied to the forward direction of the junction, the electric charge is absorbed in an appropriate manner. Accordingly, the potential has a negligible effect in the forward direction and can be easily compensated for in the circuit design. When the excessive external electric field is applied in the reverse direction to the gate junction, the potential of the junction is elevated to the voltage at which the primary breakdown of the junction is effected and thereafter the external electric charge is absorbed by the primary breakdown of the diode clamping circuit and any potential greater than the primary breakdown voltage of the diode junction or gate junction is not applied to the gate junction portion thereby preventing such junction from being brought to a secondary breakdown voltage level. Accordingly, by utilizing a clamping diode circuit the gate is protected, by making the primary breakdown voltage of the junction lower than the breakdown voltage of the gate.

Also, it is usually assumed that the primary breakdown voltage of the junction at which primary breakdown occurs is equally applied over the entire area of the junction. However, in actual circuits, primary breakdown begins at the portion of the junction that has the greatest concentration of diffused dopants. During manufacturing of the semi-conductor integrated circuits, when the substrate and diffusion layers are formed, the concentration of dopant is not uniform. Accordingly, when a fast rising potential is applied to the junction, the current is concentrated in the more concentrated portion of the junction. Consequently, primary breakdown is more likely to occur in the portion of the junction in which the electric current is concentrated.

Thus, an often observed phenomena in MOS devices of the type depicted in FIG. 2 is that the drain junction, which forms the portion of the MOS device coupled to the output terminal is often broken by unexpected electric charges, such as an electrostatic field, being applied thereto. This is particularly the case in drain portion breakdown observed in devices during assembly of the integrated circuitry and during handling and packaging of C-MOS integrated circuit devices.

Figure 3:
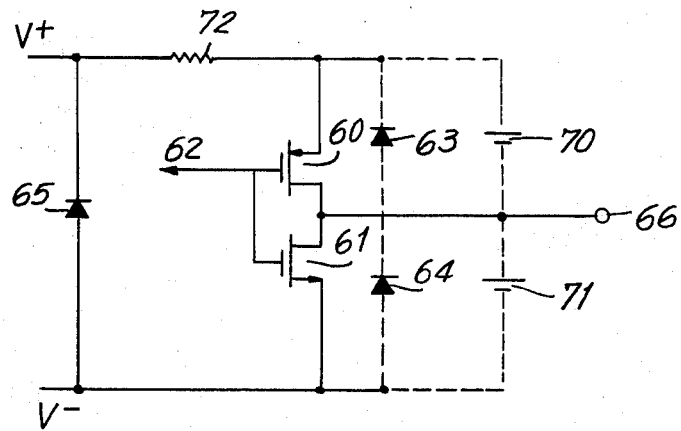
FIG. 3 is an equivalent circuit diagram of the C-MOS transistor circuit illustrated in FIG. 2.

Reference is now made to FIG. 3, wherein an equivalent circuit diagram of the C-MOS circuit of the type illustrated in FIG. 2, with the equivalent breakdown voltages of the respective drain terminals illustrated as diodes is depicted. The P-channel transistor 60 and N-channel transistor 61 are coupled to define a common gate terminal 62 and common drain terminal 66. The diodes 63 and 64 represent the respective junctions between the drain terminals of the transistors 60 and 61 and the reference potentials of the adjacent portions of the substrate. Diode 65 represents the junction between the respective P-type and N-type substrates. The power sources 70 and 71 represent the respective potential applied between power sources V+, V− and the drain output terminal 66. Accordingly, the diodes 63, 64 and 65 become reverse biased junctions subject to primary breakdown when the reverse voltage applied thereto is raised to the reverse breakdown voltage of the junction. However, when a pulsed potential is applied to the terminal in the same manner as noted above with respect to the gate clamp diode, secondary breakdown often occurs at the inverse junctions illustrated by diodes 63, 64 and 65. Moreover, until secondary breakdown reaches the inverse junctions 65 between respective potentials of the substrate, drain junctions represented by diodes 63 and 64 at the output terminal are frequently broken due to the resistance portion 72 disposed intermediate the MOS transistors and the regions. Accordingly, the instant invention is characterized by preventing breakdown voltages capable of destroying the drain portion from being applied thereto.

Figure 4:
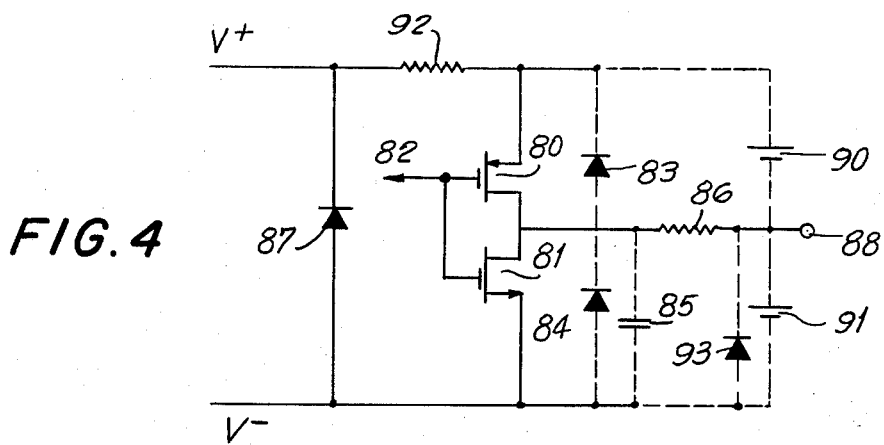
FIG. 4 is an equivalent circuit diagram of a C-MOS transistor circuit constructed in accordance with a preferred embodiment of the instant invention.

Reference is now made to FIG. 4, wherein an equivalent circuit diagram of a C-MOS semi-conductor integrated circuit constructed in accordance with a preferred embodiment of the instant invention is depicted. P-channel transistor 80 and N-channel transistor 81 have a commonly connected gate input terminal 82 and a commonly connected drain output terminal 88. The respective reverse junctions of the drain terminals of the P-channel transistor 80 and N-channel transistor 81 are represented by diodes 83 and 84 respectively, the junction between the respective power source potentials V+ and V− is illustrated by diode 87 and the respective potentials between the drain terminal 88 and the power sources V+ and V$^{31}$ are represented by power sources 90 and 91. A time constant circuit comprised of a resistor 86 and inherent capacitance 85 is disposed intermediate the drain coupled terminals and the output terminal 88 in order to absorb a portion of the potential of a high pulse signal applied to the terminal 88 and restrict the amount of current applied to the drain terminals. Such a circuit prevents the secondary breakdown of the reverse junction represented by diodes 83 and 84. It has been found that in actual use, if the value of the resistor 86 is in the range of 100 ohms to 100 K ohms, the peak voltage of an electric field capable of causing secondary breakdown of the reverse junction of diodes 83 and 84 increases on the order of at least twice and up to 10 times the potential of an electric field required to reach the secondary breakdown without such a circuit.

It is noted that the larger the magnitude of the resistance 86, the greater the protection to the drain. However, loading considerations require that the output load condition determine the magnitude of the resistance 86 since same is coupled in series to the output impedance of the C-MOS inverter. Accordingly, when a low power consumption TTL, such as the 74 L series of Texas Instruments, is driven, an output current of 0.2 mA must be provided for a potential of 5 V applied thereto, and the value of the resistance 86 must be less than 2.5 K ohm to effect a voltage reduction of 0.5 V. Nevertheless, in applications where a low impedance load having an impedance in the range of several megohms to several -ten megohms or greater is driven, such as in a liquid crystal display cell, the resistor can have a magnitude of several-hundred K ohms to several megohms. When the current requirements of the output is within a range of several mA to several -ten mA, such as when driving a TTL or light emitting diode, the resistance is required to be no greater than a range of several-hundred ohms to several -ten ohms or less.

It is further noted that the resistor 86 can be formed by a diffusion layer, which diffusion layer is the same as the diffusion layers comprising the MOS transistor. In addition to the diffusion layer in the substrate the resistance can be formed from amorphous (polycrystalline)-silicon used for silicon gate MOS devices such amorphous silicon being deposited on the substrate or on an insullator on the substrate. Finally, metals of the type utilized in the electrodes such as aluminum can be etched into a circuitious path and thereby uses a resistance, it being noted that each of the above techniques for forming the resistance may be utilized to form resistance elements in semi-conductor integrated circuitry without difficulty.

In accordance with a further embodiment of the instant invention, the avoidance of secondary breakdown of the junction represented by diode 87 and the junctions illustrated by diodes 83 and 84 is effected by selectively reducing the gap between certain diffused regions of the semiconductor integrated circuit. As is detailed below, by causing a primary breakdown over a selected portion of the junctions of the device, secondary breakdown caused by higher concentrations of dopant or other defects in the integrated circuit can readily be avoided.

Figure 6:
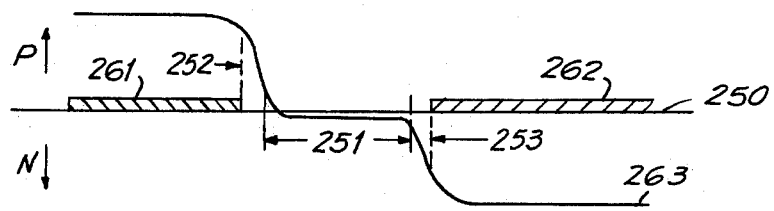
FIGS. 6 and 7 are illustrative diagrams illustrating the relationship of the depletion layer in the junction formed between two heavily doped diffusion layers at different distances in response to a reverse bias being applied across the junction.
Figure 7:
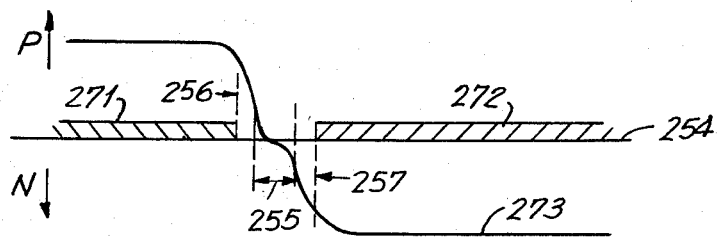

In the C-MOS device illustrated in FIG. 2, the breakdown voltage of drains 33 and 36 are determined by the respective distance between the drains 33 and 36 and the stoppers 34 and 38 respectively, rather than at the junctions between substrates 31 and 30. This results from the fact that the breakdown voltage of the junction is the voltage when the electric field added to the depletion layer extending to the junction is above the isolating intensity. The depletion layer extending between the respective drain regions and the associated stoppers adjacent thereto caused by the reverse bias is more than the depletion layer between the thin diffused layers of the substrates 31 and 30. Referring specifically to FIGS. 6 and 7, a comparison of the depletion layers with respect to the distance between heavily-doped P-type and N-type diffusion layers is illustrated. In FIG. 6, the respective heavily-doped diffusion layers are illustrated as being relatively far apart. An N-type region 250 includes P-type and N-type heavily doped regions diffused therein, masks 261 and 262 defining the respective end points 252 and 253 of the P and N-type regions. The curve 263 illustrates the type and density of actual diffusion. Accordingly, the depletion layer caused by a reverse bias applied across the junction is illustrated as 251. In FIG. 7, the diffusion regions 271 and 272 are positioned closer to each other and the expanse of the depletion layer when the reverse bias is applied thereto is considerably reduced. By a comparison of FIGS. 6 and 7, it is appreciated that all things being equal, the breakdown voltage between two heavily doped diffusion layers is determined by the distance therebetween, and that the closer the distance, the lower the breakdown voltage.

Moreover, when the gap between the heavily doped diffusion layers is minimized, uniform junctions can be obtained, such junctions being considerably less influenced by high concentrations of dopant and other abnormalities created when the integrated semi-conductor circuit is formed. Accordingly, the primary breakdown over a wider junction can be obtained, and the current concentration of the type likely to cause secondary breakdown can be avoided by providing closely spaced heavily doped diffusion layers. Referring to FIG. 4, if the heavily doped diffusion layers are closely spaced to the drain regions, diodes 83 and 84 have considerably lowered breakdown voltages without affecting the breakdown voltage of the entire integrated circuit. As illustrated in FIG. 4, if the resistor 86 is formed with a diffused layer, a junction 93 is formed on the side of the output terminal. Then, the outer electric potential is applied to the junction and the same provisions as noted above are taken with respect thereto. Moreover, it is possible to prevent dielectric breakdown between the gate electrode and the high voltage applied to the drain.

Nevertheless, it is noted however, that by utilizing the same measurement for all the junctions in the integrated circuit, and reducing the entire breakdown voltage, the variation of each distance between the heavily doped diffusion layers is limited by the accuracy of the mask and alignment techniques utilized to form the integrated circuit and cause a decrease in the manufacturing yield. Accordingly, it is necessary to reduce the junction distance only at the portions of the integrated circuit that are coupled to the output terminal. Accordingly, the breakdown voltage is lowered by reducing the distance between the diffusion layers only at certain selected areas, the distance between the respective diffusion layers being on the order of several $\mu$ to 200 $\mu$ at most. Thereafter, the other junctions are left with a relatively high breakdown voltage, and the device can be protected without a reduction in the yield and each of the breakdown voltages in the entire circuit.

Figure 5:
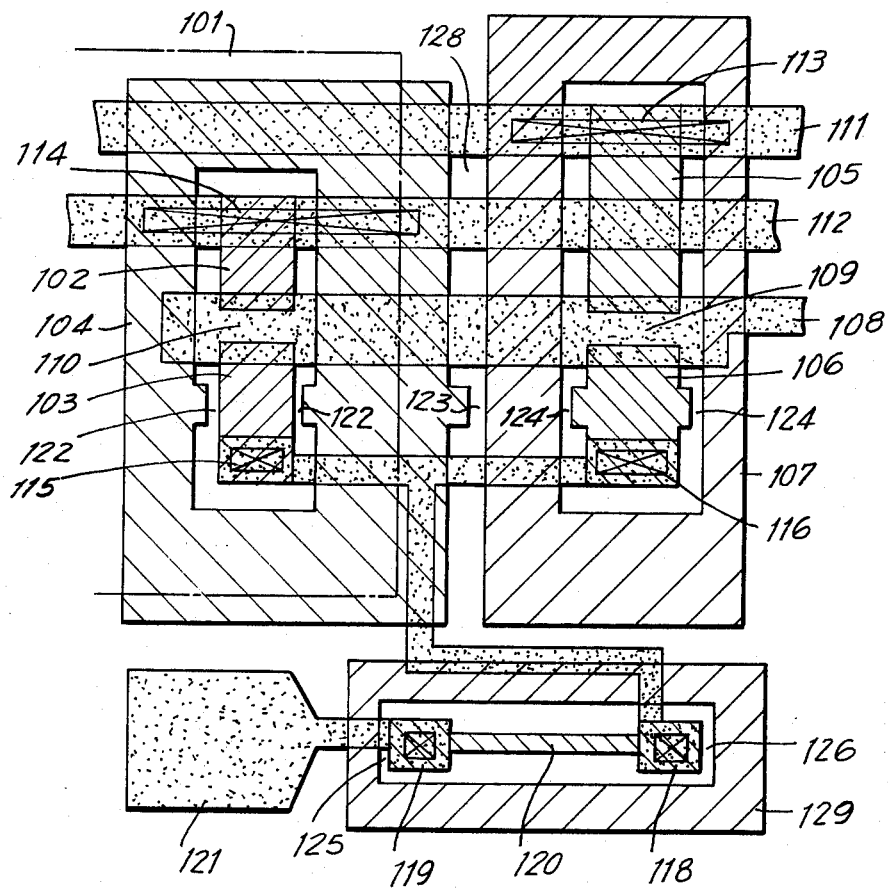
FIG. 5 is a plan view of a MOS integrated circuit constructed in accordance with a further embodiment of the instant invention.

Reference is now made to FIG. 5, wherein a plan view of a C-MOS integrated circuit constructed in accordance with the instant invention is depicted. A first N-channel MOS transistor includes a source 102 and drain 103. A P-channel MOS transistor includes a source 105 and drain 106. A positive supply electrode 111 is coupled to the source region 105 of the P-channel transistor and to a stopper region 107 of the P-channel transistor. A negative supply electrode 112 is coupled to the source region 102 of the N-channel transistor and additionally to the stopper regions 104 of the N-channel transistor. Gate electrode 108 is aligned with the respective gate regions 110 and 109 of the N-channel and P-channel transistors and defines a common electrode with respect thereto. The N-channel transistor includes a heavily doped P-layer stopper 104 and the P-channel transistor includes a heavily doped N-layer stopper 107. Also, the lightly doped P-diffusion layer forming the N-channel transistor substrate is illustrated as 101.

Both the P-channel transistor and the N-channel transistor drain regions are commonly coupled to an output terminal electrode 121 through an integrated circuit resistance device 120 defined between respective diffused layers 119 and 118. Accordingly, the commonly coupled drain regions are coupled through an output resistor in the same manner illustrated in FIG. 4 to obtain the benefit described with respect thereto. Also, a stopper region 129 is formed around the respective diffused regions forming the resistance device 120.

The breakdown voltage is further reduced in accordance with the instant invention, by narrowing the distance between each of the heavily doped diffusion layers so that a secondary breakdown of the remaining junctions are avoided. The reduced gaps 122 through 126 illustrate the reduced depletion layers formed in order to prevent secondary breakdown of the remaining junctions of the C-MOS device. For example, the heavily doped N-region 103 defining the drain of the N-channel transistor is formed with a narrow gap between same and the heavily doped P+ stopper region 104 to thereby reduce the secondary breakdown voltage between same and make same substantially uniform across the entire gap therebetween. Accordingly, by selectively reducing the distance between the heavily doped regions, a secondary breakdown voltage of considerably less magnitude than that of the remaining junctions of the transistor is effected. Moreover, as illustrated in FIG. 5, these distances can be easily obtained by forming the doped P-layer and N-layer mask during manufacture of the semi-conductor integrated circuitry.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be inter reted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. A semi-conductor integrated circuit comprising in combination, a C-MOS circuit formed of at least a P-channel field-effect transistor and an N-channel field-effect transistor, said circuit having respective input and output terminals, said field-effect transistors having commonly coupled drain output terminals, resistance means for reducing the secondary breakdown of said field-effect transistors, said resistance means being coupled intermediate said commonly coupled drain output terminals and said circuit output terminal, power terminals, and a stopper region associated with said drain output terminal, said stopper regions being referenced to one of said power terminals, the distance between at least one of said drain output terminals and said associated stopper regions defining a junction region adapted to be subject to primary breakdown at a voltage lower than a predetermined voltage, said predetermined voltage being lower than the primary breakdown voltage of the remaining junction of said C-MOS circuit.

2. A semi-conductor integrated circuit as claimed in claim 1, and including field-effect circuit means including said field-effect transistors and resistance means, said field-effect circuit means being coupled to said output and power terminals, said one junction region of said drain region adapted to be subject to primary breakdown at a voltage lower than a predetermined voltage being further adapted to be subject to primary breakdown at a voltage lower than the primary breakdown voltage of the remaining junctions of said field-effect circuit means.

3. A semi-conductor integrated circuit as claimed in claim 2, wherein said junction region is adapted to be subject to primary breakdown at a voltage that is also lower than the breakdown voltage of the other junction regions of the integrated circuit.

4. A semi-conductor integrated circuit as claimed in claim 2, wherein the junction region between each of said output drain terminals and associated stopper regions define junction regions adapted to be subject to primary breakdown at a voltage lower than said predetermined voltage.

5. A semi-conductor integrated circuit as claimed in claim 4, wherein the junction regions between said respective stopper regions are adapted to be subject to primary breakdown at a voltage lower than said predetermined voltage.

6. A semi-conductor integrated circuit as claimed in claim 5, wherein said resistance means is formed of at least two diffused regions and an associated stopper region, the junction regions between said diffused regions defining said resistance means and said associated stopper region being adapted to be subject to primary breakdown at a voltage lower than said predetermined voltage.

7. A semi-conductor integrated circuit as claimed in claim 2 wherein said junction region subject to primary breakdown at a voltage lower than said predetermined voltage is defined by a gap having a length in the range of several microns to 200 microns.

8. A semi-conductor integrated circuit as claimed in claim 6, wherein each of said junction regions subject to primary breakdown at a voltage lower than said predetermined voltage are defined by gaps having a length in the range of several microns to 200 microns.

9. A semi-conductor integrated circuit as claimed in claim 1, wherein said resistance means is in the range of several hundred ohms to several meg-ohms.

* * * * *